United States Patent
Kim et al.

(10) Patent No.: US 10,163,398 B2
(45) Date of Patent: Dec. 25, 2018

(54) METHOD OF DRIVING A DISPLAY PANEL AND A DISPLAY APPARATUS FOR PERFORMING THE SAME

(71) Applicant: SAMSUNG DISPLAY CO., LTD., Yongin-si, Gyeonggi-Do (KR)

(72) Inventors: Soo-Kyung Kim, Gwangju (KR); Hyo-Jin Lee, Yongin-si (KR); Dong-Hoon Chae, Daegu (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 16 days.

(21) Appl. No.: 15/399,867

(22) Filed: Jan. 6, 2017

(65) Prior Publication Data

US 2017/0200416 A1    Jul. 13, 2017

(30) Foreign Application Priority Data

Jan. 8, 2016    (KR) .................. 10-2016-0002745

(51) Int. Cl.
| | | |
|---|---|---|
| *H01L 27/32* | (2006.01) | |
| *G09G 3/3258* | (2016.01) | |
| *G09G 3/3266* | (2016.01) | |
| *G09G 3/3291* | (2016.01) | |

(Continued)

(52) U.S. Cl.
CPC ......... *G09G 3/3258* (2013.01); *G09G 3/3266* (2013.01); *G09G 3/3291* (2013.01); *G09G 3/3208* (2013.01); *G09G 3/3233* (2013.01); *G09G 2300/043* (2013.01); *G09G 2300/0809* (2013.01); *G09G 2300/0819* (2013.01);

(Continued)

(58) Field of Classification Search
CPC ........... G09G 3/3233; G09G 2320/043; G09G 2300/0819; G09G 2300/0842; G09G 2300/0852; G09G 2310/0251; G09G 3/3258; G09G 3/3208; G09G 3/3266; G09G 3/3291; G09G 2300/043;

(Continued)

(56) References Cited

U.S. PATENT DOCUMENTS

2006/0208979 A1* 9/2006 Fish ..................... G09G 3/3233
                                                                 345/81
2007/0075939 A1* 4/2007 Cho ..................... G09G 3/3233
                                                                 345/76

(Continued)

FOREIGN PATENT DOCUMENTS

| KR | 1019980058640 | 10/1998 |
|---|---|---|
| KR | 1020080040133 | 5/2008 |
| KR | 1020120028426 | 3/2012 |

*Primary Examiner* — Michael J Eurice
(74) *Attorney, Agent, or Firm* — F. Chau & Associates, LLC

(57) ABSTRACT

A method of driving a display panel includes adjusting a level of a data sustaining voltage or an on bias voltage during an on bias compensating period, applying the on bias voltage to pixels through data lines during an on bias period, which is subsequent to the on bias compensating period, to adjust a voltage level of control electrodes of driving transistors of the pixels, initiating a voltage of anode electrodes of organic light emitting elements of the pixels during an initiating period, applying data voltages to the pixels through the data lines during a scanning period, and turning on the organic light emitting elements of the pixels during an emission period.

20 Claims, 16 Drawing Sheets

(51) Int. Cl.
G09G 3/3208 (2016.01)
G09G 3/3233 (2016.01)

(52) U.S. Cl.
CPC ............ G09G 2300/0842 (2013.01); G09G 2300/0852 (2013.01); G09G 2300/0866 (2013.01); G09G 2310/0251 (2013.01); G09G 2310/061 (2013.01); G09G 2310/08 (2013.01); G09G 2320/043 (2013.01); H01L 27/3276 (2013.01)

(58) Field of Classification Search
CPC ... G09G 2300/0809; G09G 2300/0866; G09G 2310/061; G09G 2310/08; H01L 27/3276
See application file for complete search history.

(56) References Cited

U.S. PATENT DOCUMENTS

| | | | | |
|---|---|---|---|---|
| 2008/0109605 A1* | 5/2008 | Ko | ............ | G09G 3/20 711/122 |
| 2008/0238953 A1* | 10/2008 | Ogura | ............ | G09G 3/3275 345/697 |
| 2009/0309863 A1* | 12/2009 | Seto | ............ | G09G 3/3233 345/212 |
| 2010/0079419 A1* | 4/2010 | Shibusawa | ............ | H01L 27/3272 345/204 |
| 2012/0062613 A1* | 3/2012 | Park | ............ | G09G 3/3233 345/690 |
| 2013/0099692 A1* | 4/2013 | Chaji | ............ | H05B 37/02 315/224 |
| 2013/0128015 A1* | 5/2013 | Sung | ............ | H04N 13/04 348/55 |
| 2013/0175941 A1* | 7/2013 | Wu | ............ | H05B 33/0896 315/226 |
| 2014/0118328 A1* | 5/2014 | Guo | ............ | G09G 3/3233 345/212 |
| 2014/0333512 A1* | 11/2014 | In | ............ | G09G 3/3233 345/76 |
| 2015/0364089 A1* | 12/2015 | Pyo | ............ | G09G 3/3258 345/77 |
| 2016/0155387 A1* | 6/2016 | Kim | ............ | G09G 3/3291 345/76 |
| 2017/0124939 A1* | 5/2017 | Kang | ............ | H01L 27/3262 |
| 2017/0249902 A1* | 8/2017 | Park | ............ | G09G 3/3258 |

* cited by examiner

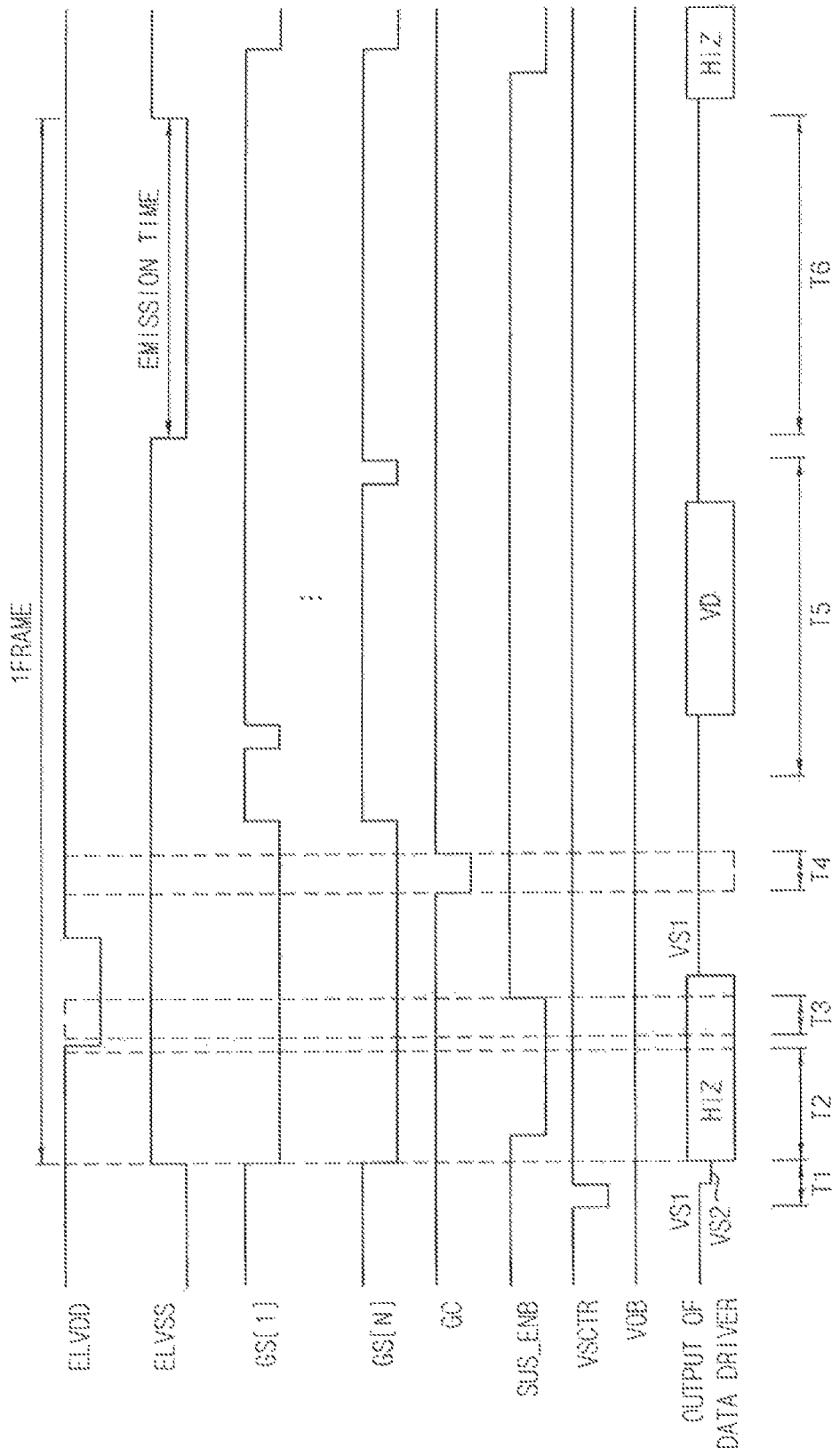

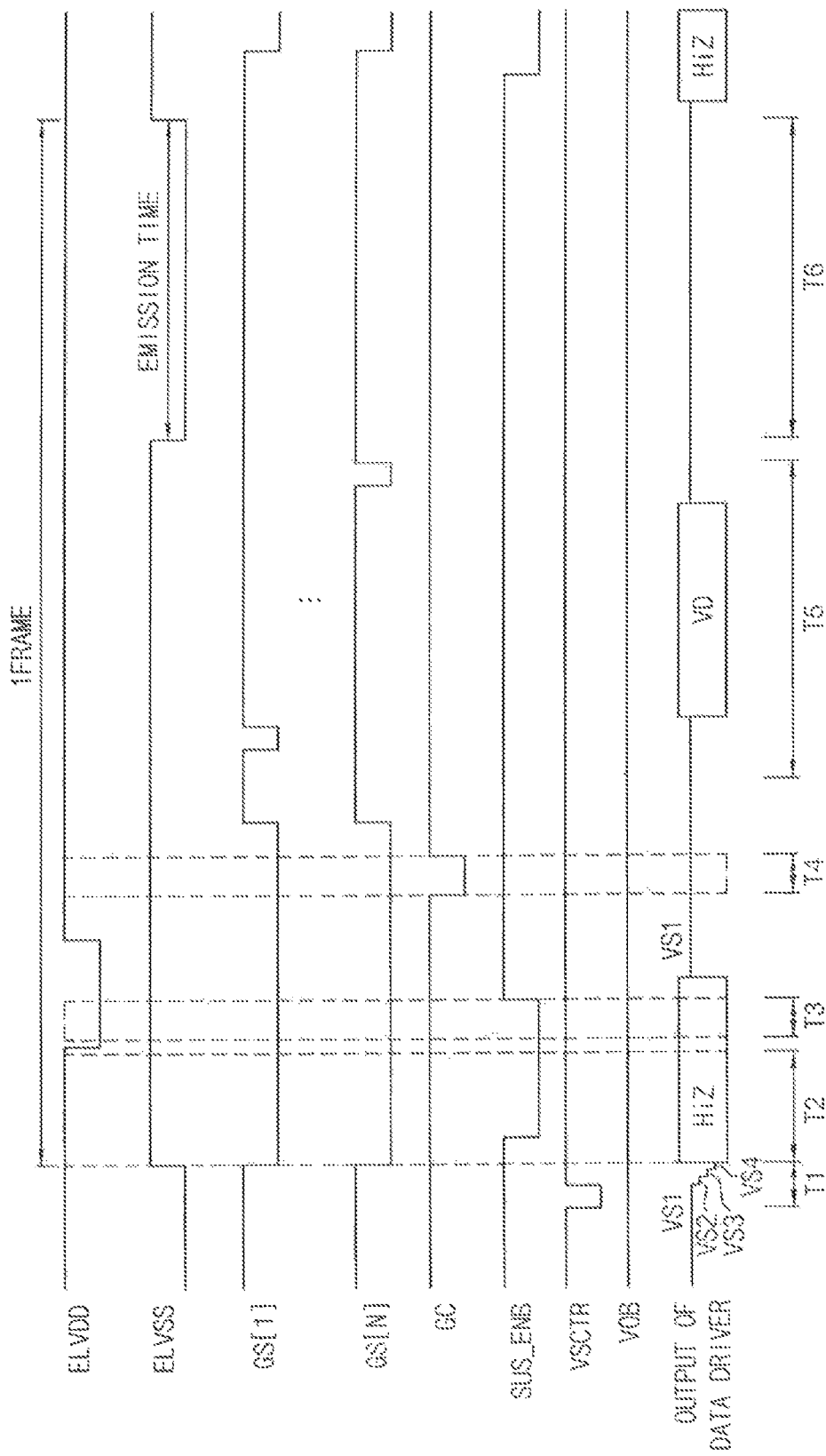

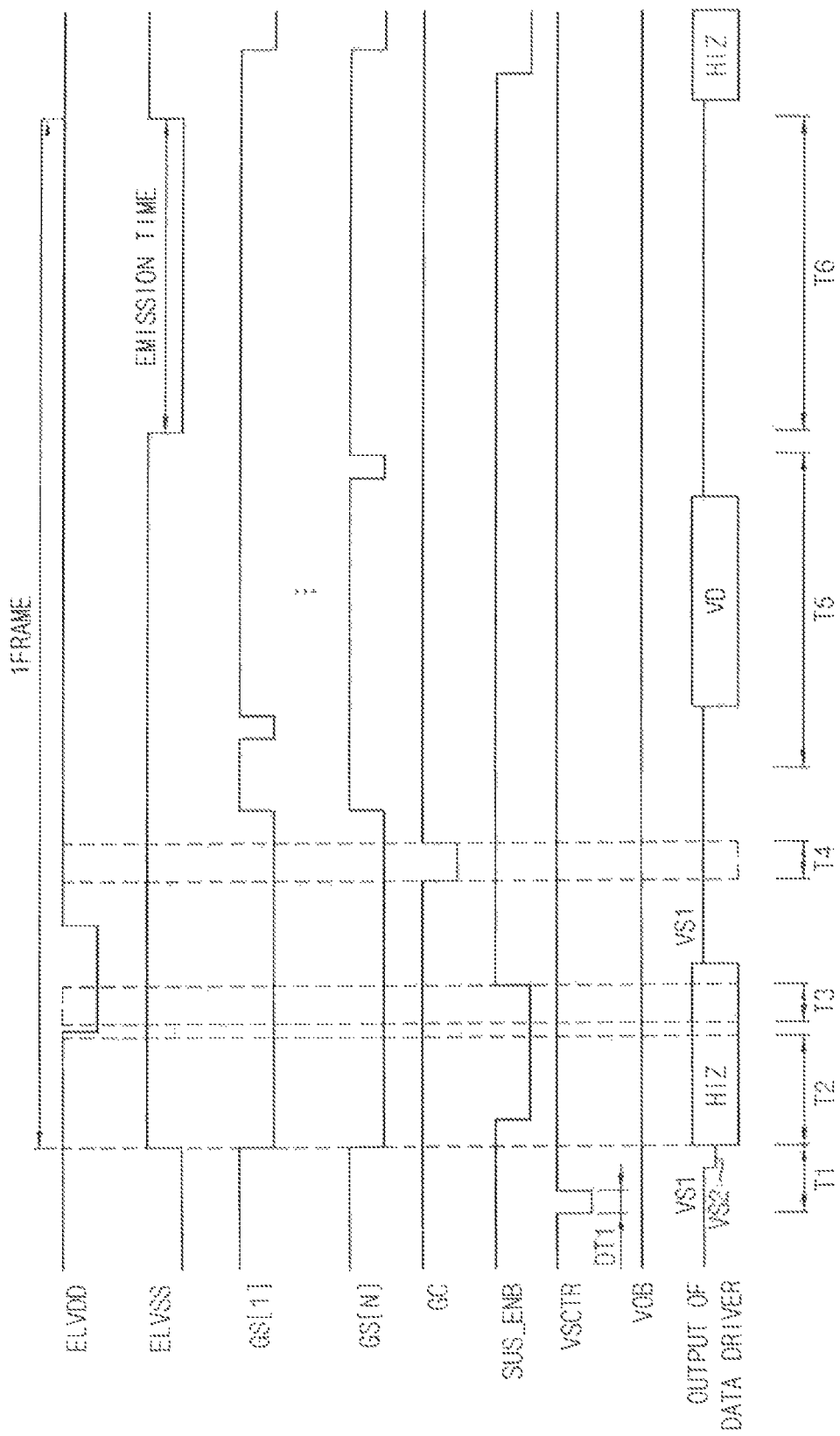

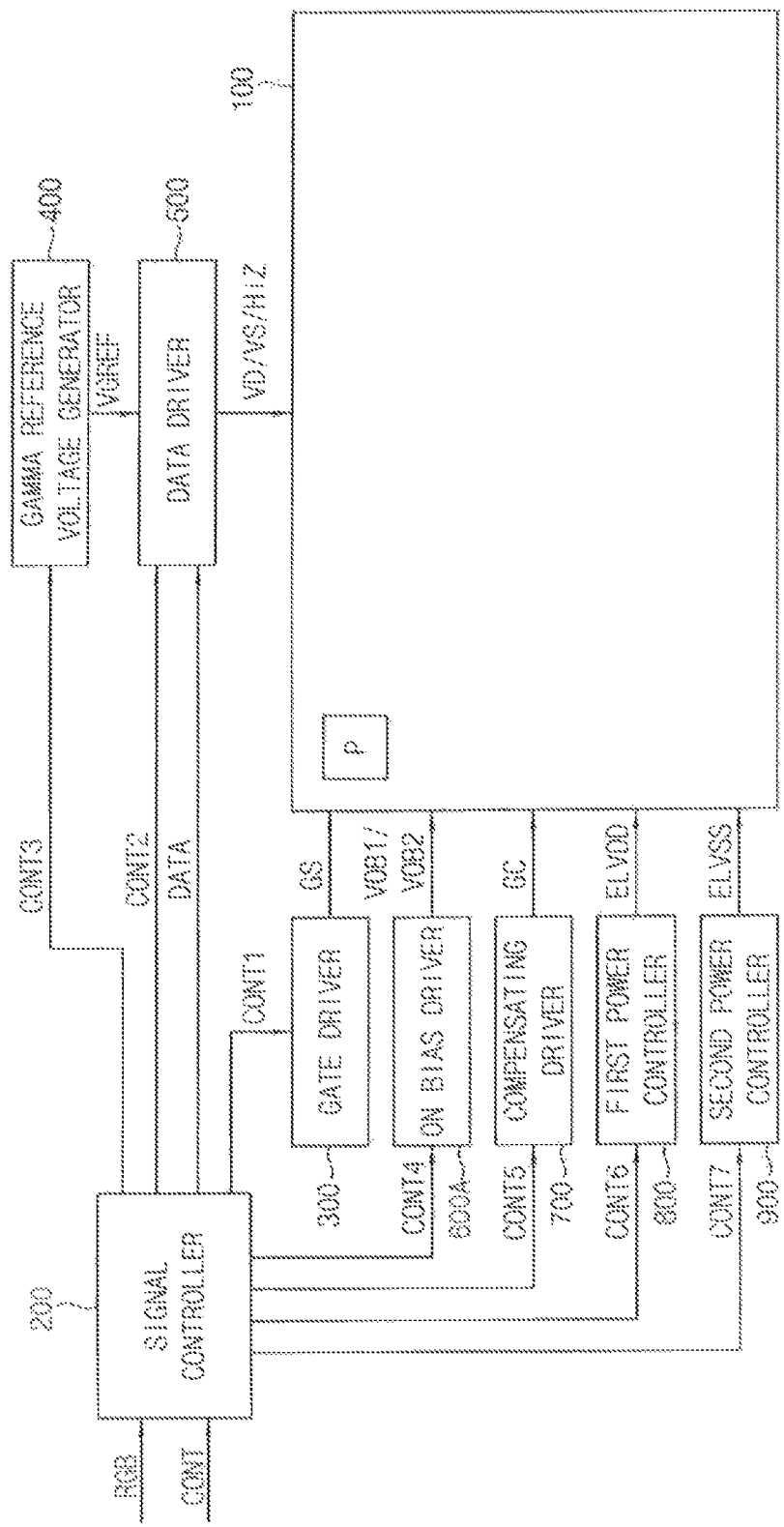

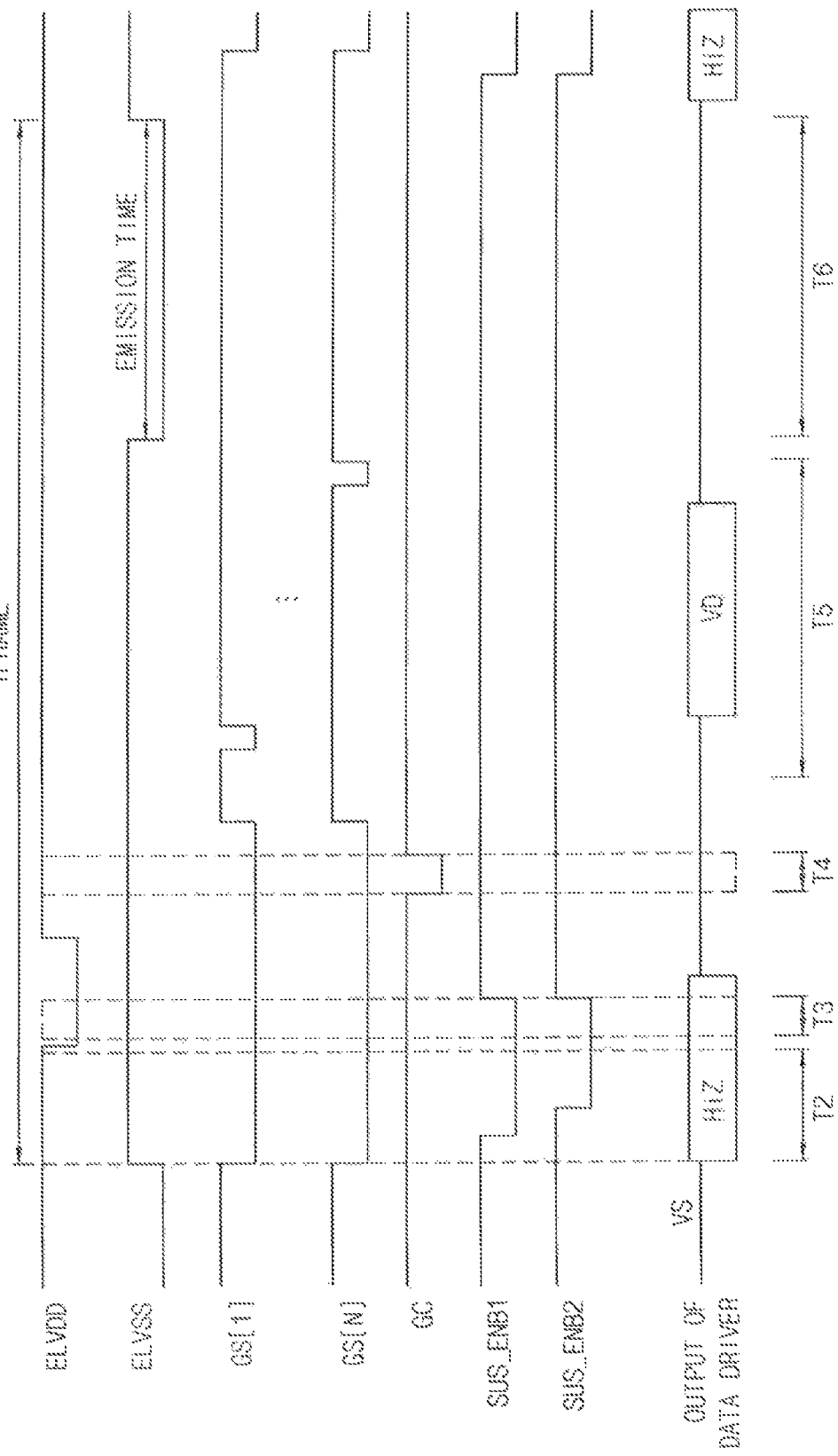

METHOD OF DRIVING A DISPLAY PANEL AND A DISPLAY APPARATUS FOR PERFORMING THE SAME

CROSS-REFERENCE TO RELATED APPLICATION

This application claims priority under 35 U.S.C. § 119 to Korean Patent Application No. 10-2016-0002745, filed on Jan. 8, 2016 in the Korean Intellectual Property Office (KIPO), the disclosure of which is incorporated by reference herein in its entirety.

TECHNICAL FIELD

Exemplary embodiments of the inventive concept relate to a method of driving a display panel and a display apparatus for performing the method, and more particularly, a method of driving a display panel with simultaneous emission and a display apparatus for performing the method.

DISCUSSION OF RELATED ART

As the size of a display panel of an organic light emitting diode display apparatus increases, a width of a signal transmitting line at a panel lead-in portion may decrease.

Accordingly, a resistance of the signal transmitting line may increase and a peak current flowing through the signal transmitting line may increase. When a high peak current flows through the signal transmitting line, the signal transmitting line may be damaged.

SUMMARY

According to an exemplary embodiment of the inventive concept, a method of driving a display panel includes adjusting a level of a data sustaining voltage or an on bias voltage during an on bias compensating period, applying the on bias voltage to pixels through data lines during an on bias period, which is subsequent to the on bias compensating period, to adjust a voltage level of control electrodes of driving transistors of the pixels, initiating a voltage of anode electrodes of organic light emitting elements of the pixels during an initiating period, applying data voltages to the pixels through the data lines during a scanning period, and turning on the organic light emitting elements of the pixels during an emission period.

The data sustaining voltage may have at least two different levels.

During the on bias compensating period, the data sustaining voltage may decrease from a first data sustaining voltage level to a second data sustaining voltage level that is less than the first data sustaining voltage level.

The data sustaining voltage may have at least three different levels. The data sustaining voltage may decrease in a steplike fashion during the on bias compensating period.

The level of the data sustaining voltage may be determined by a duty ratio of a sustaining voltage control signal.

The on bias voltage may have at least two different levels.

During the on bias compensating period, the on bias voltage may increase from a first on bias voltage level to a second on bias voltage level that is greater than the first on bias voltage level.

The on bias voltage having the first on bias voltage level may be transmitted to the data lines through a first on bias switching element. The on bias voltage having the second on bias voltage level may be transmitted to the data lines through a second on bias switching element.

During the on bias period, an output of a data driver may have a high impedance state, switching elements of the pixels may be turned on, a first power voltage may have a high level, and a second power voltage may have a high level.

During the initiating period, the output of the data driver may have the high impedance state, the switching elements of the pixels may be turned on, the first power voltage may have a low level, and the second power voltage may have a high level.

The method may further include decreasing an on bias control signal from a high level to a low level to output the on bias voltage.

According to an exemplary embodiment of the inventive concept, a display apparatus includes a display panel, a gate driver, a data driver, an on bias driver, a first power controller, and a second power controller. The display panel includes a plurality of pixels. The gate driver applies gate signals to the plurality of pixels through gate lines. The data driver applies data voltages to the plurality of pixels through data lines. The on bias driver applies an on bias voltage to the plurality of pixels through the data lines during an on bias period to adjust a voltage level of control electrodes of driving transistors of the pixels. The first power controller applies a first power voltage to the plurality of pixels. The second power controller applies a second power voltage to the plurality of pixels. During an on bias compensating period, which is prior to the on bias period, a level of a data sustaining voltage of the data driver or the on bias voltage of the on bias driver may be adjusted.

The data driver may be further configured to output the data sustaining voltage having at least two different levels.

The on bias driver may include on bias switching element configured to output the on bias voltage to the data lines in response to an on bias control signal.

The on bias driver may be further configured to output the on bias voltage having at least two different levels.

The on bias driver may include a first on bias switching element configured to output the on bias voltage having a first on bias voltage level to the data lines in response to an on bias control signal and a second on bias switching element configured to output the on bias voltage having a second on bias voltage level, which is greater than the first on bias voltage level, to the data lines in response to a compensating on bias control signal.

At least one of the plurality of pixels may include a switching transistor configured to turn on in response to one of the gate signals, a compensating transistor configured to turn on in response to a compensating control signal, a driving transistor configured to turn on in response to a signal at a first electrode of the compensating transistor, and an organic light emitting element connected to the driving transistor.

The on bias driver may be one on bias driver commonly connected to all of the data lines.

According to an exemplary embodiment of the inventive concept, in a method of driving a display panel including a plurality of pixels connected to data lines, divided into a first group and a second group, the method includes applying an on bias voltage to pixels of the first group through data lines of the first group with a first timing in an on bias period to adjust a voltage level of control electrodes of driving transistors of the pixels of the first group, applying the on bias voltage to pixels of the second group through data lines of the second group with a second timing in the on bias period to adjust a voltage level of control electrodes of driving transistors of the pixels of the second group, initiating a voltage of anode electrodes of organic light emitting elements of the pixels of the first and second groups during an initiating period, applying data voltages to the pixels of the first and second groups through the data lines during a scanning period, and turning on the organic light emitting elements of the pixels of the first and second groups during an emission period.

Data driving chips configured to generate the data voltages may have different timings for applying the on bias voltage.

BRIEF DESCRIPTION OF THE DRAWINGS

The above and other features of the inventive concept will become more apparent by describing in detail exemplary embodiments thereof with reference to the accompanying drawings.

FIG. 4 is a timing diagram illustrating input and output signals of the on bias driver of FIG. 1 and a pixel of the display panel of FIG. 1 according to an exemplary embodiment of the inventive concept.

FIG. 6 is a timing diagram illustrating input and output signals of the on bias driver of FIG. 1 and the pixel of the display panel of FIG. 1 according to an exemplary embodiment of the inventive concept.

FIGS. 7A and 7B are timing diagrams illustrating input and output signals of the on bias driver of FIG. 1 and the pixel of the display panel of FIG. 1 according to an exemplary embodiment of the inventive concept.

FIG. 8 is a block diagram illustrating a display apparatus according to an exemplary embodiment of the inventive concept.

FIG. 14 is a timing diagram illustrating input and output signals of the first and second on bias drivers of FIG. 12 and pixels of the display panel of FIG. 12 according to an exemplary embodiment of the inventive concept.

DETAILED DESCRIPTION OF THE EMBODIMENTS

Figure 1:
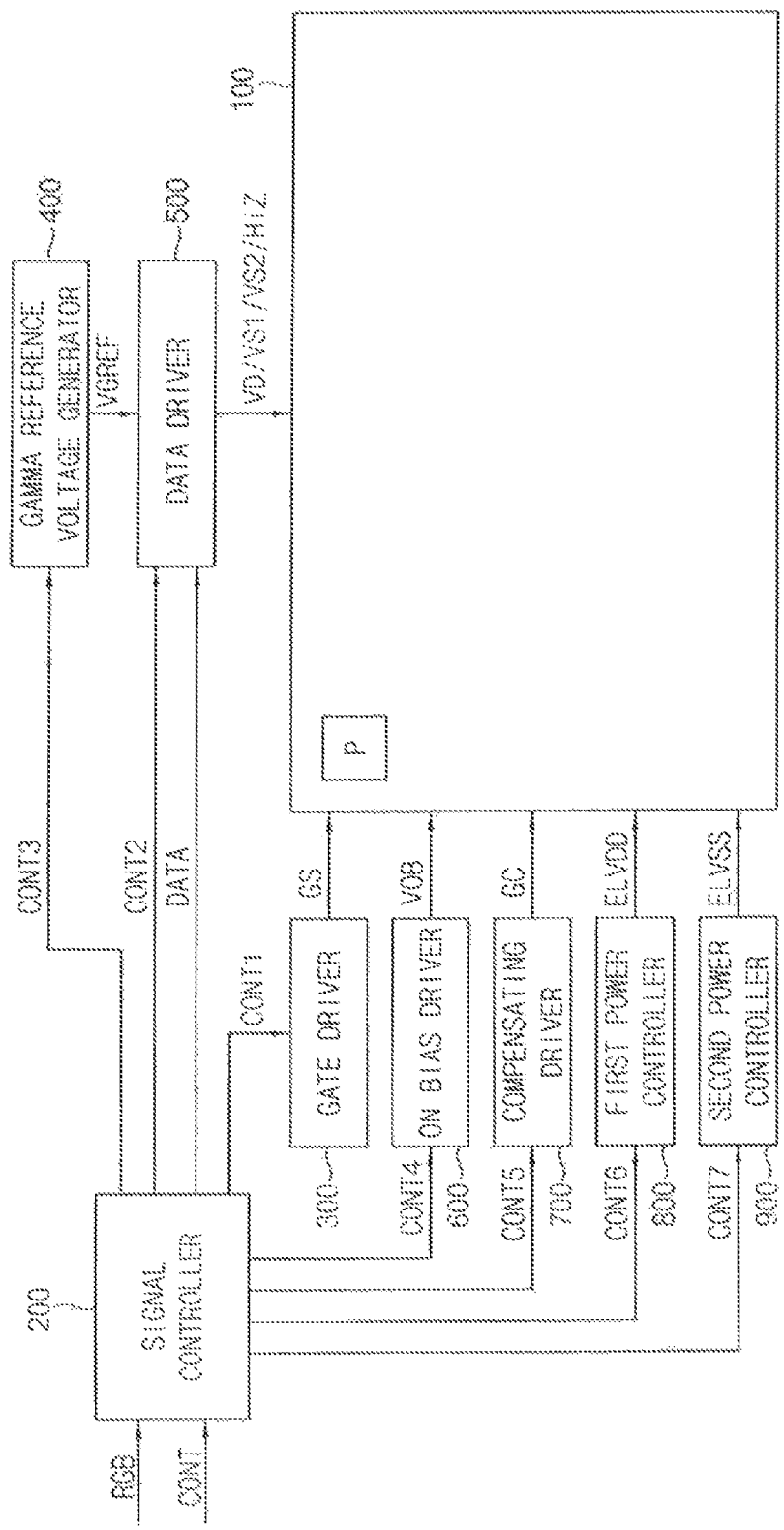
FIG. 1 is a block diagram illustrating a display apparatus according to an exemplary embodiment of the inventive concept.

Exemplary embodiments of the inventive concept will be described more fully hereinafter with reference to the accompanying drawings. Like reference numerals may refer to like elements throughout the accompanying drawings.

Exemplary embodiments of the inventive concept provide a method of driving a display panel that is capable of preventing a signal transmitting line from being damaged during an on bias period of a simultaneous emission driving method.

Exemplary embodiments of the inventive concept also provide a display apparatus for performing the above-mentioned method.

FIG. 1 is a block diagram illustrating a display apparatus according to an exemplary embodiment of the inventive concept.

Referring to FIG. 1, the display apparatus includes a display panel 100 and a display panel driver. The display panel driver includes a timing controller 200, a gate driver 300, a gamma reference voltage generator 400, a data driver 500, an on bias driver 600, a compensating driver 700, a first power controller 800, and a second power controller 900.

The display panel 100 has a display region on which an image is displayed and a peripheral region adjacent to the display region.

The display panel 100 includes a plurality of gate lines, a plurality of data lines, and a plurality of pixels connected to the gate lines and the data lines. The gate lines extend in a first direction and the data lines extend in a second direction crossing the first direction.

Each of the plurality of pixels includes a switching transistor, a compensating transistor, a driving transistor, and an organic light emitting element. The plurality of pixels may be disposed in a matrix form. The structure of each of the plurality of pixels will be explained below with reference to FIG. 3.

The timing controller 200 receives input image data RGB and an input control signal CONT from an external apparatus. The input image data may include red image data R, green image data G, and blue image data B. The input control signal CONT may include a master clock signal and a data enable signal. The input control signal CONT may further include a vertical synchronizing signal and a horizontal synchronizing signal.

The timing controller 200 generates a first control signal CONT1, a second control signal CONT2, a third control signal CONT3, a fourth control signal CONT4, a fifth control signal CONT5, a sixth control signal CONT6, a seventh control signal CONT7, and a data signal DATA using the input image data RGB and the input control signal CONT.

The timing controller 200 generates the first control signal CONT1 for controlling an operation of the gate driver 300 using the input control signal CONT, and outputs the first control signal CONT1 to the gate driver 300. The first control signal CONT1 may include a vertical start signal and a gate clock signal.

The timing controller 200 generates the second control signal CONT2 for controlling an operation of the data driver 500 using the input control signal CONT, and outputs the second control signal CONT2 to the data driver 500. The second control signal CONT2 may include a horizontal start signal and a load signal.

The timing controller 200 generates the data signal DATA using the input image data RGB. The timing controller 200 outputs the data signal DATA to the data driver 500.

The timing controller 200 generates the third control signal CONT3 for controlling an operation of the gamma reference voltage generator 400 using the input control signal CONT, and outputs the third control signal CONT3 to the gamma reference voltage generator 400.

The timing controller 200 generates the fourth control signal CONT4 for controlling an operation of the on bias driver 600 using the input control signal CONT, and outputs the fourth control signal CONT4 to the on bias driver 600. The fourth control signal CONT4 may include an on bias control signal for controlling a timing of on bias driving.

The timing controller 200 generates the fifth control signal CONT5 for controlling an operation of the compensating driver 700 using the input control signal CONT, and outputs the fifth control signal CONT5 to the compensating driver 700.

The timing controller 200 generates the sixth control signal CONT6 for controlling an operation of the first power controller 800 using the input control signal CONT, and outputs the sixth control signal CONT6 to the first power controller 800.

The timing controller 200 generates the seventh control signal CONT7 for controlling an operation of the second power controller 900 using the input control signal CONT, and outputs the seventh control signal CONT7 to the second power controller 900.

The gate driver 300 generates gate signals GS for driving the gate lines in response to the first control signal CONT1 received from the timing controller 200. The gate driver 300 sequentially outputs the gate signals GS to the gate lines.

The gate driver 300 may be directly mounted on the display panel 100, or may be connected to the display panel 100 as a tape carrier package (TCP) type. Alternatively, the gate driver 300 may be integrated into the display panel 100.

The gamma reference voltage generator 400 generates a gamma reference voltage VGREF in response to the third control signal CONT3 received from the timing controller 200. The gamma reference voltage generator 400 provides the gamma reference voltage VGREF to the data driver 500. The gamma reference voltage VGREF has a value corresponding to a level of the data signal DATA.

In an exemplary embodiment of the inventive concept, the gamma reference voltage generator 400 may be disposed in the timing controller 200 or in the data driver 500.

The data driver 500 receives the second control signal CONT2 and the data signal DATA from the timing controller 200, and receives the gamma reference voltages VGREF from the gamma reference voltage generator 400. The data driver 500 converts the data signal DATA into data voltages VD, which have an analog type, using the gamma reference voltage VGREF. The data driver 500 outputs the data voltages VD to the data lines.

In addition, the data driver 500 generates a data sustaining voltage, and outputs the data sustaining voltage to the data lines. In the present exemplary embodiment, the data sustaining voltage may have at least two different levels. For example, the data sustaining voltage may have a first data sustaining voltage level VS1 and a second data sustaining voltage level VS2 that is different from the first data sustaining voltage level VS1.

The output of the data driver 500 may have a high impedance state HiZ, which will be described in detail below.

The data driver 500 may be directly mounted on the display panel 100, or connected to the display panel 100 as a TCP type. Alternatively, the data driver 500 may be integrated into the display panel 100.

The on bias driver 600 applies an on bias voltage VOB to the pixels through the data lines in response to the on bias control signal of the fourth control signal CONT4. An operation and structure of the on bias driver 600 are explained below with reference to FIGS. 3 and 4.

The compensating driver 700 outputs a compensating control signal GC to turn on the compensating transistors of the pixels in response to the fifth control signal CONT5.

The first power controller 800 adjusts a first power voltage ELVDD to a high level or a low level in response to the sixth control signal CONT6. The first power controller 800 outputs the first power voltage ELVDD to the pixels.

The second power controller 900 adjusts a second power voltage ELVSS to a high level or a low level in response to the seventh control signal CONT7. The second power controller 900 outputs the second power voltage ELVSS to the pixels.

Figure 2:
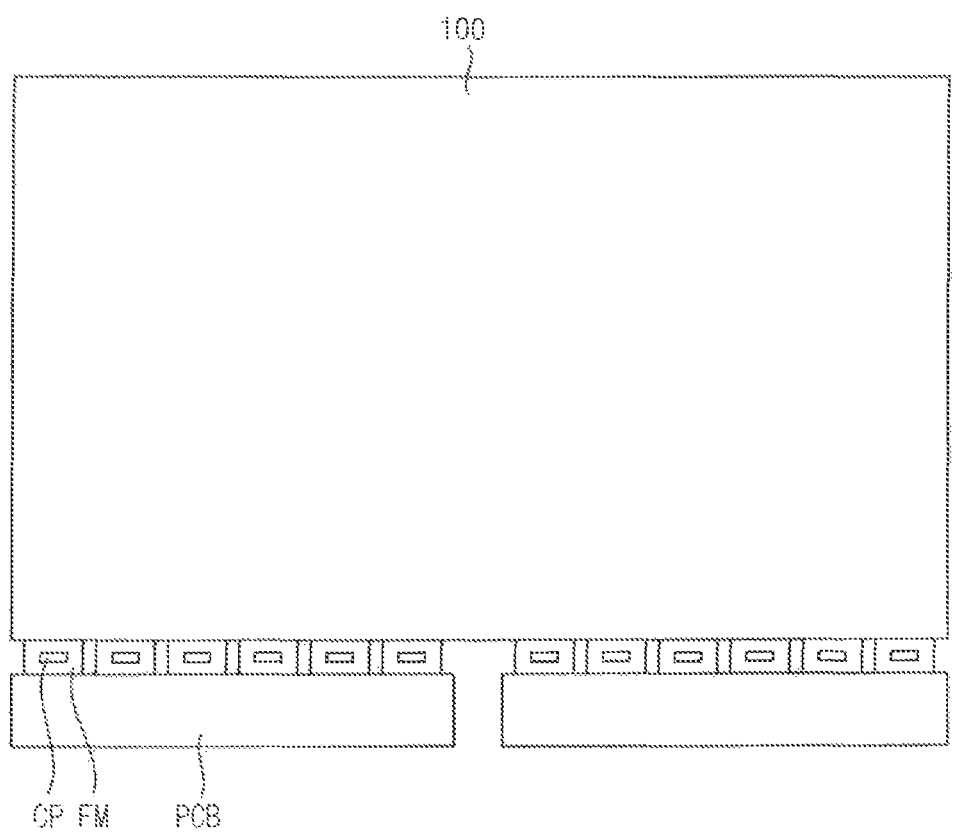
FIG. 2 is a plan view illustrating the display apparatus of FIG. 1 according to an exemplary embodiment of the inventive concept.

FIG. 2 is a plan view illustrating the display apparatus of FIG. 1 according to an exemplary embodiment of the inventive concept.

Referring to FIGS. 1 and 2, the display apparatus includes the display panel 100 and the display panel driver. The display panel driver may include a printed circuit board PCB, a flexible printed circuit board FM connecting the printed circuit board PCB and the display panel 100, and a driving chip CP disposed on the flexible printed circuit board FM.

For example, the display panel driver may include a plurality of the flexible printed circuit boards FM. As such, the display panel driver may include a plurality of the driving chips CP. One driving chip CP may be disposed on one flexible printed circuit board FM. The driving chip CP may be a driving chip of the gate driver 300 or a driving chip of the data driver 500.

Figure 3:
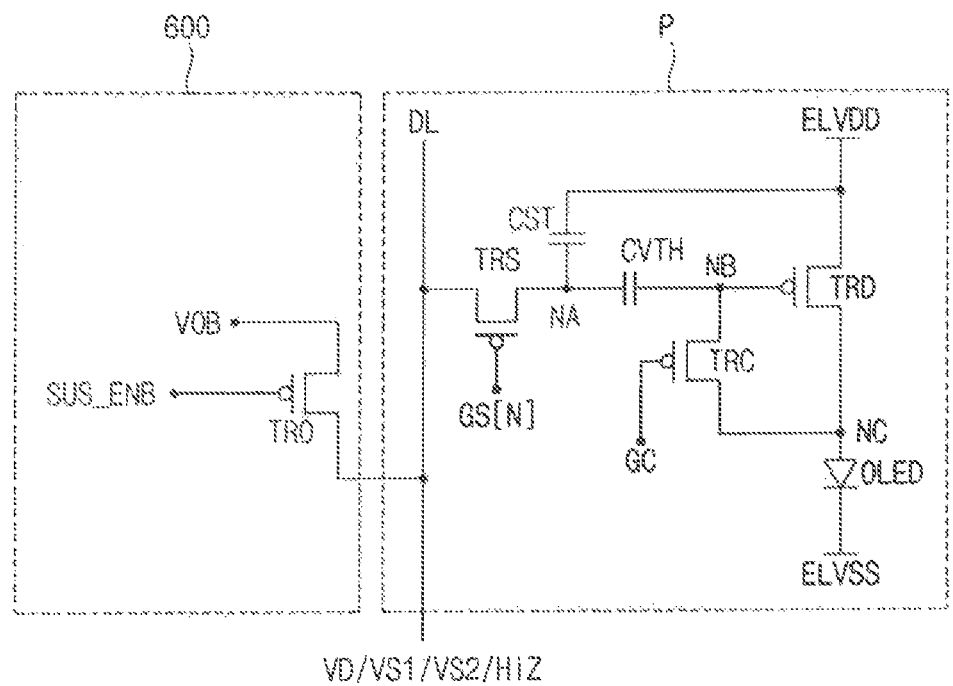
FIG. 3 is a circuit diagram illustrating an on bias driver of FIG. 1 and a display panel of FIG. 1 according to an exemplary embodiment of the inventive concept.
Figure 5A:
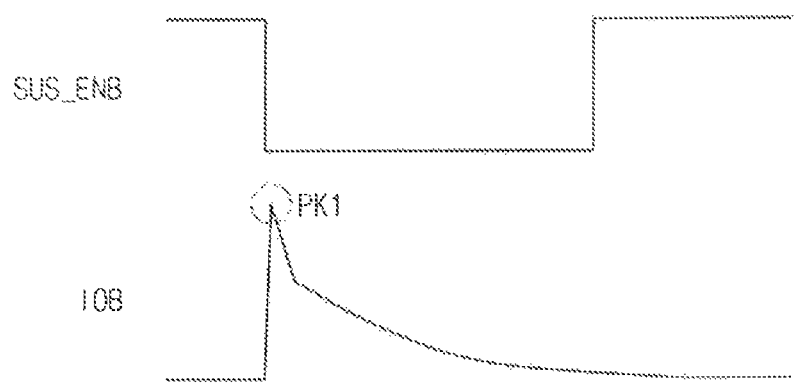
FIG. 5A is a waveform diagram illustrating a peak current of an on bias voltage applying portion when a data sustaining voltage of a data driver of FIG. 1 is not adjusted.
Figure 5B:
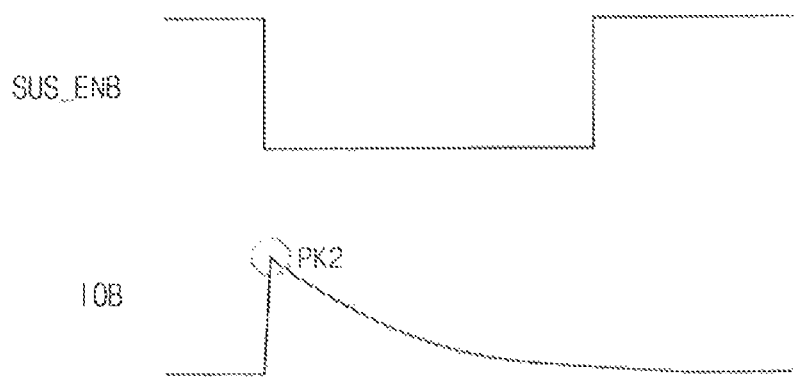
FIG. 5B is a waveform diagram illustrating the peak current of the on bias voltage applying portion when the data sustaining voltage of the data driver of FIG. 1 is adjusted.

FIG. 3 is a circuit diagram illustrating the on bias driver 600 of FIG. 1 and the display panel 100 of FIG. 1 according to an exemplary embodiment of the inventive concept. FIG. 4 is a timing diagram illustrating input and output signals of the on bias driver 600 of FIG. 1 and a pixel of the display panel 100 of FIG. 1 according to an exemplary embodiment of the inventive concept. FIG. 5A is a waveform diagram illustrating a peak current of an on bias voltage applying portion when a data sustaining voltage of the data driver 500 of FIG. 1 is not adjusted. FIG. 5B is a waveform diagram illustrating the peak current of the on bias voltage applying portion when the data sustaining voltage of the data driver 500 of FIG. 1 is adjusted.

The timing diagram of FIG. 4 includes an on bias compensating period T1, an on bias period T2, an initiating period T3, a compensating period T4, a scanning period T5, and an emission period T6. These periods will be described in more detail below.

Referring to FIGS. 1 to 5B, the pixel P of the display panel 100 includes a switching transistor TRS which is turned on in response to the gate signal GS (e.g., an Nth gate signal GS[N] for driving an Nth gate line), a compensating transistor TRC which is turned on in response to the compensating control signal GC, a driving transistor TRD which is turned on in response to a signal of a first electrode of the compensating transistor TRC, and an organic light emitting element OLED.

The pixel P may further include a storage capacitor CST for storing the data voltage VD and a compensating capacitor CVTH for storing a threshold voltage compensating voltage.

The switching transistor TRS includes a control electrode to which the gate signal GS is applied, a first electrode connected to a data line DL (among the plurality of data lines in the display panel 100), and a second electrode connected to a first node NA.

The storage capacitor CST includes a first electrode to which the first power voltage ELVDD is applied and a second electrode connected to the first node NA.

The compensating capacitor CVTH includes a first electrode connected to the first node NA and a second electrode connected to a second node NB.

The compensating transistor TRC includes a control electrode to which the compensating control signal GC is applied, a first electrode connected to the second node NB, and a second electrode connected to a third node NC.

The driving transistor TRD includes a control electrode connected to the second node NB, a first electrode to which the first power voltage ELVDD is applied, and a second electrode connected to the third node NC.

The organic light emitting element OLED includes an anode electrode connected to the third node NC and a cathode electrode to which the second power voltage ELVSS is applied.

The data line DL is connected to the data driver 500 of FIG. 1. An output of the data driver 500 may have the data voltage VD, the data sustaining voltage with the first and second data sustaining voltage levels VS1 and VS2, and the high impedance state HiZ. Hereinafter, the data sustaining voltage with the first and second data sustaining voltage levels VS1 and VS2 may be referred to as the data sustaining voltage VS1/VS2.

The data voltage VD is grayscale data representing a luminance of the pixel P of the display panel 100. The data sustaining voltage VS1/VS2 is a voltage to maintain the voltage level of the data line DL for a duration when the data voltage VD is not applied to the data line DL. The data sustaining voltage VS1/VS2 may be set to a data voltage having a relatively low grayscale which is close to black. In the present exemplary embodiment, the data sustaining voltage may have at least two different levels. For example, as described above, the data sustaining voltage may have the first data sustaining voltage level VS1 and the second data sustaining voltage level VS2 that is less than the first data sustaining voltage level VS1.

The high impedance state HiZ indicates that the output of the data driver 500 has a floating state. The output of the data driver 500 may have the high impedance state HiZ during the on bias period T2 and the initiating period T3, as illustrated in FIG. 4.

The on bias driver 600 may include an on bias switching element TRO. The on bias switching element TRO may output the on bias voltage VOB to the data line DL in response to an on bias control signal SUS_ENB (e.g., included in the fourth control signal CONT4).

The on bias switching element TRO may include a control electrode to which the on bias control signal SUS_ENB is applied, a first electrode to which the on bias voltage VOB is applied, and a second electrode connected to the data line DL.

In the present exemplary embodiment, one on bias driver 600 may be commonly connected to all of the plurality of data lines of the display panel 100.

As shown in FIG. 4, during the on bias period T2, the on bias voltage VOB is applied to the pixel P through the data line DL because the on bias control signal SUS_ENB decreases from a high level to a low level.

For example, gate signals GS[1] to GS[N] (the gate signals GS for driving first to Nth gate lines) have low levels during the on bias period T2, so that the switching elements TRS of the pixels P are turned on. Thus, the output of the data driver 500 has the high impedance state HiZ.

In addition, the first power voltage ELVDD may have a high level and the second power voltage ELVSS may have a high level during the on bias period T2.

As described above, when the on bias control signal SUS_ENB decreases from a high level to a low level, the on bias switching element TRO is turned on so that the on bias voltage VOB is applied to the data line DL.

The switching element TRS is turned on so that the on bias voltage VOB is transmitted to the first node NA through the switching transistor TRS. Prior to the on bias period T2, the voltage level of the first node NA may be the level of the data sustaining voltage remaining at the data line DL. When the on bias period T2 is started, the voltage level of the first node NA may be the on bias voltage VOB. The level of the data sustaining voltage may be a high grayscale voltage which is close to a white gray scale. The on bias voltage VOB may be a relatively low level.

The voltage at the control electrode of the driving transistor TRD (e.g., the second node NB) may be coupled with the voltage of the first node NA so that the voltage of the second node NB may be changed. For example, the voltage of the second node NB may be coupled with the voltage drop of the first node NA so that the voltage of the second node NB may decrease.

During the on bias period T2, the switching transistor TRS is turned on and the compensating transistor TRC is turned off. Although a voltage having a low level is applied to the control electrode of the driving transistor TRD, both of the first power voltage ELVDD and the second power voltage ELVSS have high levels so that the driving transistor TRD is not turned on.

Referring to FIG. 5A, if the data sustaining voltage has a single voltage level, when the on bias control signal SUS_ENB decreases to a low level, the voltage at the first node NA suddenly drops from the data sustaining voltage (e.g., VS1 of FIG. 4) to the on bias voltage VOB. As a result, a high peak current (PK1 of JOB) flows through a signal transmitting line that connecting the on bias driver 600 to all of the data lines DL of the display panel 100. Thus, the signal transmitting line may be damaged.

On the other hand, in the present exemplary embodiment, during the on bias compensating period T1, which is prior to the on bias period T2, the level of the data sustaining voltage applied to the data line DL is adjusted. During the on bias compensating period T1, the data sustaining voltage may decrease from the first data sustaining voltage level VS1 to the second data sustaining voltage level VS2, which is less than the first data sustaining voltage level VS1.

For example, the data driver 500 may decrease the data sustaining voltage from the first data sustaining voltage level VS1 to the second data sustaining voltage level VS2 in response to a sustaining voltage control signal VSCTR.

According to an exemplary embodiment of the inventive concept, a timer may adjust a timing to decrease the data sustaining voltage after the sustaining voltage control signal VSCTR is applied to the data driver 500.

During the on bias compensating period T1, the first power voltage ELVDD may have a high level and the second power voltage ELVSS may have a low level.

When the data sustaining voltage decreases to the second data sustaining voltage level VS2, during the on bias period T2, the voltage level at the first node NA decreases from the second data sustaining voltage level VS2 to the on bias voltage VOB. Accordingly, the amount of change in the voltage at the first node NA decreases during the on bias period T2 (as compared to FIG. 5A).

Therefore, as shown in FIG. 5B, when the on bias control signal SUS_ENB decreases to a low level during the on bias period T2, the voltage at the first node NA decreases from the second data sustaining voltage level VS2 (which is lower than the first data sustaining voltage level VS1) to the on bias voltage VOB. As such, the peak current (PK2 of JOB) flowing through the signal transmitting line is less than the peak current (PK1 of JOB) flowing through the signal transmitting line in FIG. 5A.

During the initiating period T3, an anode electrode of the organic light emitting element OLED (e.g., the third node NC) of the pixel P is initiated. During the initiating period T3, the gate signals GSM to GS[N] maintain low levels and thus, the switching elements TRS of the pixels P maintain a turned-on state. During the initiating period T3, the output of the data driver 500 still has the high impedance state HiZ, the first power voltage ELVDD has a low level, and the second power voltage ELVSS has a high level.

For each of the pixels P, the switching transistor TRS is turned on and the compensating transistor TRC is turned off. A low level voltage is applied to the control electrode of the driving transistor TRD, and as described above, the first power voltage ELVDD has a low level and the second power voltage ELVSS has a high level. Accordingly, the driving transistor TRD is turned on.

The switching transistor TRS and the driving transistor TRD are turned on so that the voltage of the anode electrode of the organic light emitting element OLED (e.g., the third node NC) is initiated. For example, the voltage of the anode electrode of the organic light emitting element OLED may have the low level of the first power voltage ELVDD.

During the compensating period T4, the differences in threshold voltages among the driving transistors TRD of the pixels P may be compensated. The gate signals GS[1] to GS[N] maintain low levels, and thus, the switching elements TRS of the pixels P maintain a turned-on state. The output of the data driver 500 has the first data sustaining voltage level VS1, the first power voltage ELVDD has a high level, and the second power voltage ELVSS has a high level.

The compensating control signal GS has a low level so that the compensating transistor TRC is turned on. As the compensating transistor TRC is turned on, the driving transistor TRD is connected by a diode connection and the voltage including the threshold voltage component is applied to the first node NA. Accordingly, the threshold voltage component of the driving transistor TRD is not affected when determining the driving current according to the data voltage VD. Thus, differences due to the various threshold voltages of the driving transistors TRD may be removed for all of the pixels P.

During the scanning period T5, the gate driver 300 of FIG. 1 generates and outputs the gate signals GSM to GS[N] to the gate lines GL. For example, the driver 300 may sequentially output the gate signals GSM to GS[N] to the gate lines GL.

The data driver 500 generates the data voltages VD corresponding to grayscales of the input image data RGB. The data voltages VD are applied to the pixels P in response to pulses of the gate signals GS[1] to GS[N]. The data voltages VD may be stored at the storage capacitors CST of the pixels P.

The first power voltage ELVDD and the second power voltage ELVSS have high levels, and the driving transistor TRD is not turned on.

During the emission period T6, the organic light emitting elements OLED of the pixels P may be turned on so that the pixels P of the display panel 100 simultaneously emit light. The first power voltage ELVDD has a high level and the second power voltage ELVSS has a low level at this time.

According to the present exemplary embodiment, as described above, during the on bias compensating period T1 which is prior to the on bias period T2, the data sustaining voltage applied to the data lines DL decreases from the first data sustaining voltage level VS1 to the second data sustaining voltage level VS2, so that the peak current flowing through the signal transmitting line, which connects the on bias driver 600 to the data lines DL, may decrease. Thus, damage to the signal transmitting line may be prevented.

FIG. 6 is a timing diagram illustrating input and output signals of the on bias driver 600 and the pixel P of the display panel 100 according to an exemplary embodiment of the inventive concept.

The method of driving the display panel and the display apparatus according to the present exemplary embodiment is substantially the same as the method described with reference to FIGS. 1 to 5B, except for the level of the data sustaining voltage. Thus, the same reference numerals will be used to refer to the same or like parts as those described with reference to FIGS. 1 to 5B, and any repetitive explanation concerning these elements will be omitted.

Referring to FIGS. 1 to 3 and 5A to 6, during the on bias period T2, the on bias voltage VOB is applied to the driving transistor TRD of the pixel P through the data line DL.

When the on bias control signal SUS_ENB decreases from a high level to a low level, the on bias switching transistor TRO is turned on so that the on bias voltage VOB may be transmitted to the data line DL.

As shown in FIG. 5A, if the data sustaining voltage has a single voltage level, when the on bias control signal SUS_ENB decreases to a low level, the voltage at the first node NA suddenly drops from the data sustaining voltage (e.g., VS1 of FIG. 4) to the on bias voltage VOB, thus, resulting in a high peak current flowing through the signal transmitting line connecting the on bias driver 600 to all of the data lines DL of the display panel 100. Thus, the signal transmitting line may be damaged.

On the other hand, in the present exemplary embodiment, during the on bias compensating period T1, which is prior to the on bias period T2, the level of the data sustaining voltage applied to the data line DL is adjusted.

In the present exemplary embodiment, the data sustaining voltage may have at least three different voltage levels. During the on bias compensating period T1, the data sustaining voltage may decrease in a steplike fashion.

For example, in response to the sustaining voltage control signal VSCTR, the data driver 500 may decrease the data sustaining voltage from the first data sustaining voltage level VS1 to the second data sustaining voltage level VS2 that is less than the first data sustaining voltage level VS1, from the second data sustaining voltage level VS2 to a third data sustaining voltage level VS3 that is less than the second data sustaining voltage level VS2, and from the third data sustaining voltage level VS3 to a fourth data sustaining voltage level VS4 that is less than the third data sustaining voltage level VS3.

According to an exemplary embodiment of the inventive concept, a timer may adjust a timing to decrease the data sustaining voltage after the sustaining voltage control signal VSCTR is applied to the data driver 500.

According to the present exemplary embodiment, during the on bias compensating period T1 which is prior to the on bias period T2, the data sustaining voltage applied to the data lines DL decreases from the first data sustaining voltage level VS1 to the fourth data sustaining voltage level VS4 in a steplike fashion, so that the peak current flowing through the signal transmitting line, which connects the on bias driver 600 to the data lines DL, may decrease. Thus, damage to the signal transmitting line may be prevented.

Figure 7B:
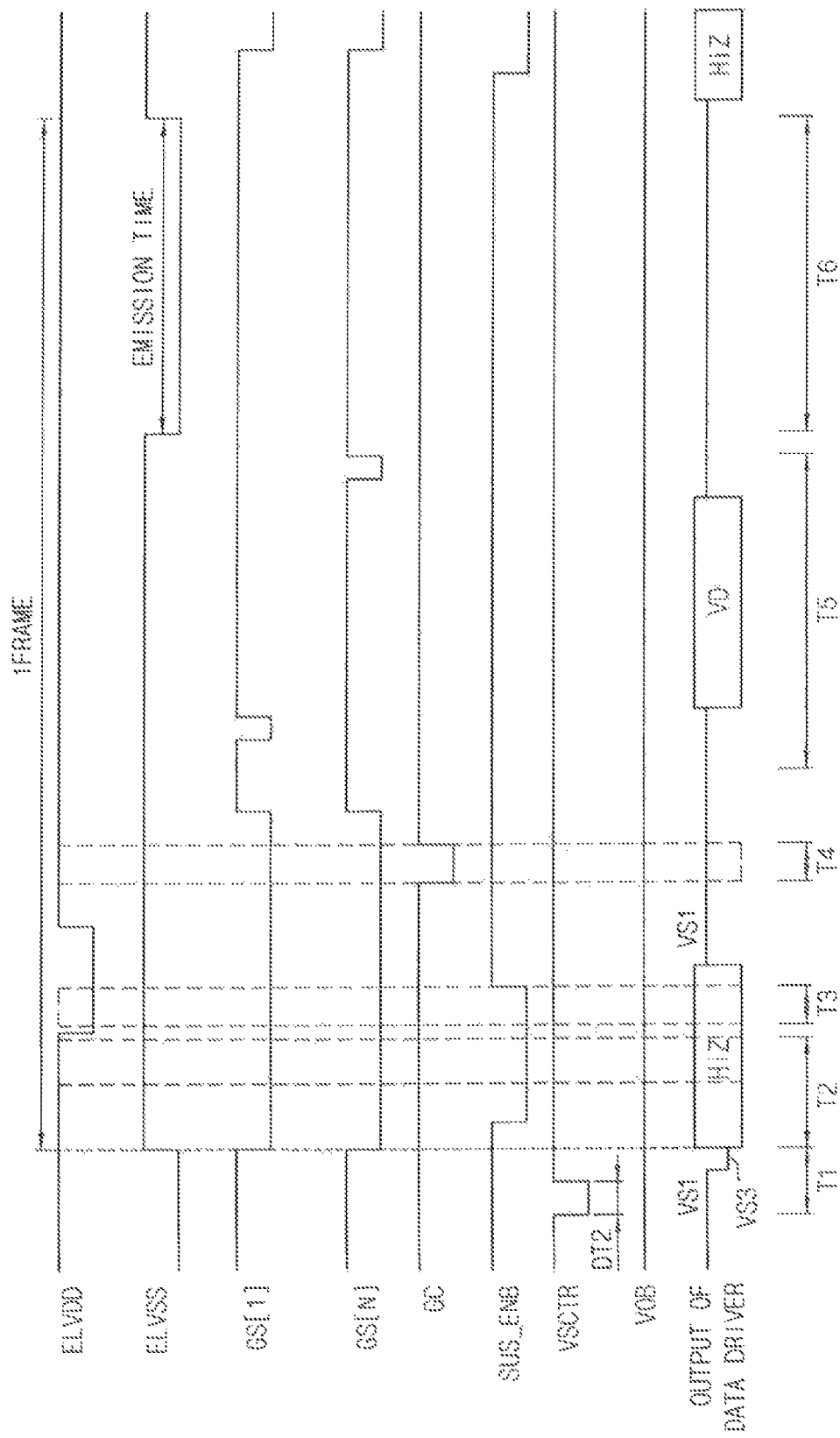

FIGS. 7A and 7B are timing diagrams illustrating input and output signals of the on bias driver 600 and the pixel P of the display panel 100 according to an exemplary embodiment of the inventive concept.

The method of driving the display panel and the display apparatus according to the present exemplary embodiment is substantially the same as the method described with reference to FIGS. 1 to 5B, except for the level of the data sustaining voltage. Thus, the same reference numerals will be used to refer to the same or like parts as those described with reference to FIGS. 1 to 5B, and any repetitive explanations concerning these elements will be omitted.

Referring to FIGS. 1 to 3, 5A, 5B, 7A, and 7B, during the on bias period T2, the on bias voltage VOB is applied to the driving transistor TRD of the pixel P through the data line DL.

When the on bias control signal SUS_ENB decreases from a high level to a low level, the on bias switching transistor TRO is turned on so that the on bias voltage VOB may be transmitted to the data line DL.

As shown in FIG. 5A, if the data sustaining voltage has a single voltage level, when the on bias control signal SUS_ENB decreases to a low level, the voltage at the first node NA suddenly drops from the data sustaining voltage (e.g., VS1 of FIG. 4) to the on bias voltage VOB, thus, resulting in a high peak current flowing through the signal transmitting line connecting the on bias driver 600 to all of the data lines DL of the display panel 100. Thus, the signal transmitting line may be damaged.

On the other hand, in the present exemplary embodiment, during the on bias compensating period T1, which is prior to the on bias period T2, the level of the data sustaining voltage applied to the data line DL is adjusted.

Referring to FIG. 7A, during the on bias compensating period T1, the data sustaining voltage may decrease from the first data sustaining voltage level VS1 to the second data sustaining voltage level VS2 that is less than the first data sustaining voltage level VS1.

For example, the data driver 500 may decrease the data sustaining voltage from the first data sustaining voltage level VS1 to the second data sustaining voltage level VS2 in response to the sustaining voltage control signal VSCTR.

In the present exemplary embodiment, the level of the data sustaining voltage may be determined by a duty ratio of the sustaining voltage control signal VSCTR. For example, the sustaining voltage control signal VSCTR has a first duty ratio DT1. Accordingly, the level of the data sustaining voltage decreases from the first data sustaining voltage level VS1 to the second data sustaining voltage level VS2.

Referring to FIG. 7B, during the on bias compensating period T1, the data sustaining voltage may decrease from the first data sustaining voltage level VS1 to the third data sustaining voltage level VS3 that is less than the first data sustaining voltage level VS1.

For example, the data driver 500 may decrease the data sustaining voltage from the first data sustaining voltage level VS1 to the third data sustaining voltage level VS3 in response to the sustaining voltage control signal VSCTR. The third data sustaining voltage level VS3 in FIG. 7B may be less than the second data sustaining voltage level VS2 in FIG. 7B.

In the present exemplary embodiment, the level of the data sustaining voltage may be determined by the duty ratio of the sustaining voltage control signal VSCTR. For example, the sustaining voltage control signal VSCTR has a second duty ratio DT2. Accordingly, the level of the data sustaining voltage decreases from the first data sustaining voltage level VS1 to the third data sustaining voltage level VS3. For example, the second duty ratio DT2 in FIG. 7B may be greater than the first duty ratio D1 in FIG. 7A.

According to the present exemplary embodiment, during the on bias compensating period T1 which is prior to the on bias period T2, the data sustaining voltage applied to the data lines DL decreases from the first data sustaining voltage level VS1 to the second data sustaining voltage level VS2 or the third data sustaining voltage level VS3. As a result, the peak current flowing through the signal transmitting line, which connects the on bias driver 600 to the data lines DL, may decrease. Thus, damage to the signal transmitting line may be prevented.

Figure 9:
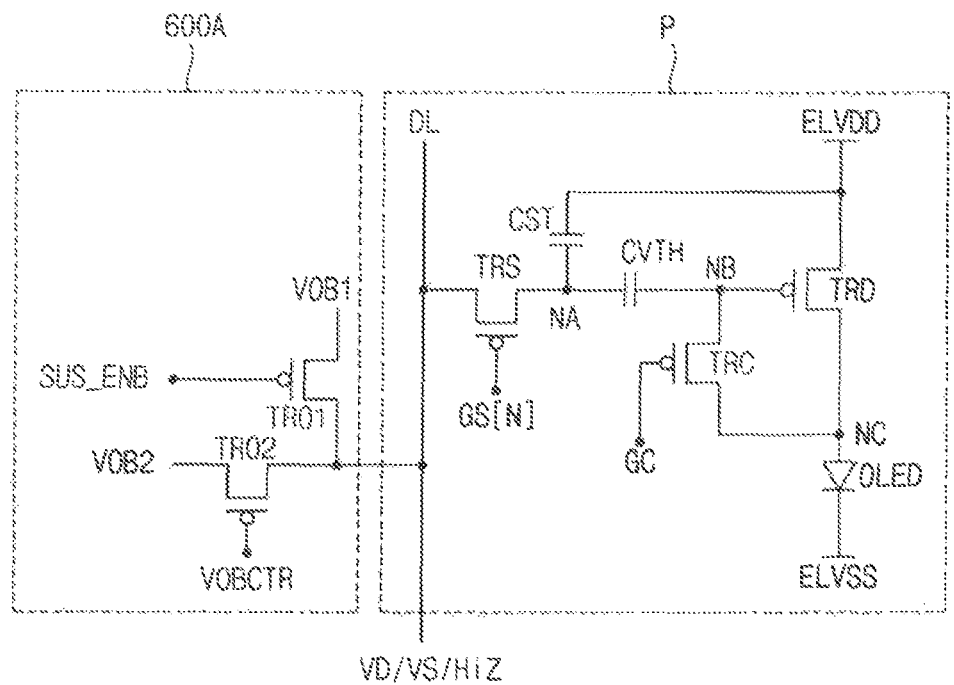
FIG. 9 is a circuit diagram illustrating an on bias driver of FIG. 8 and a display panel of FIG. 8 according to an exemplary embodiment of the inventive concept.
Figure 10:
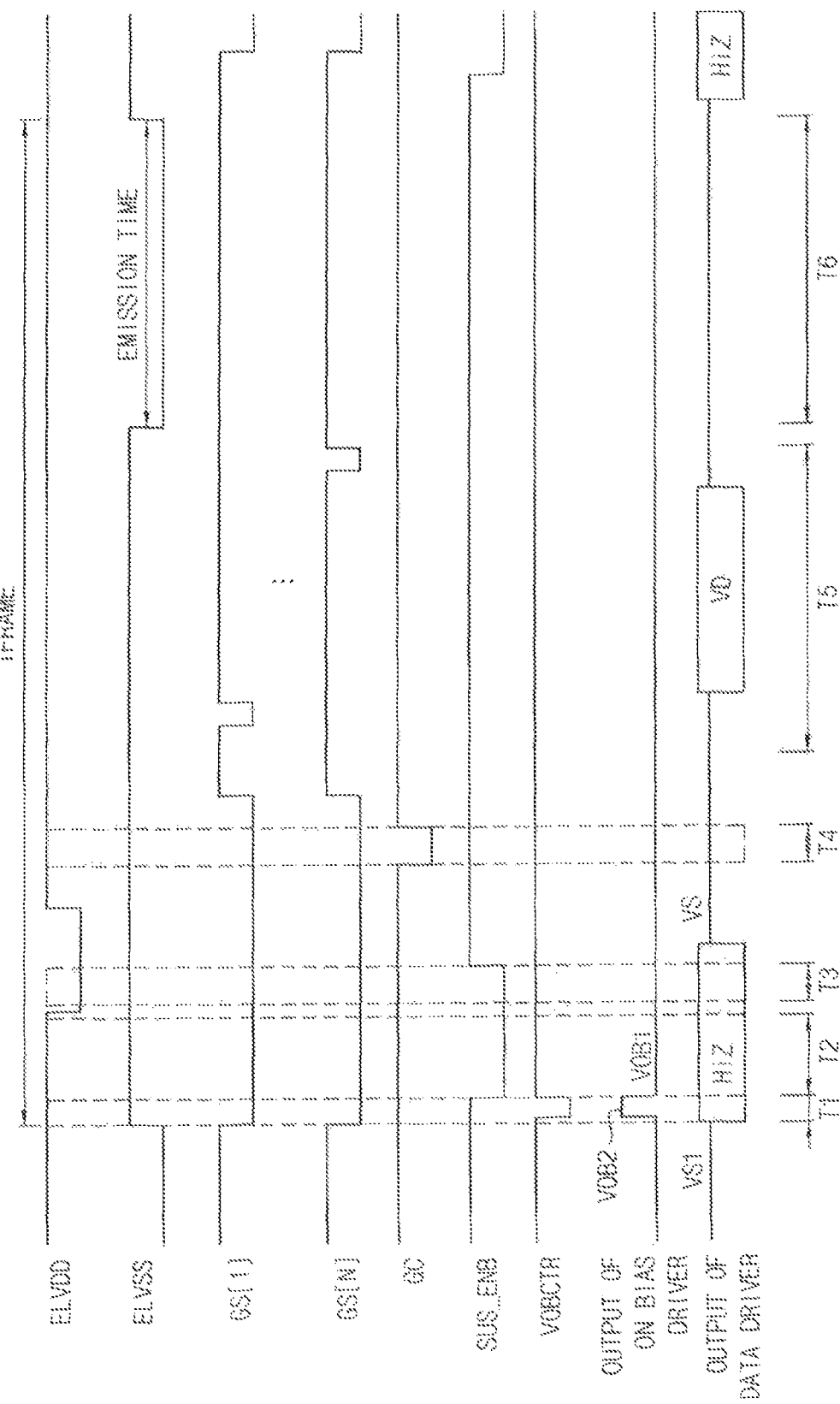
FIG. 10 is a timing diagram illustrating input and output signals of the on bias driver of FIG. 8 and a pixel of the display panel of FIG. 8 according to an exemplary embodiment of the inventive concept.
Figure 11A:
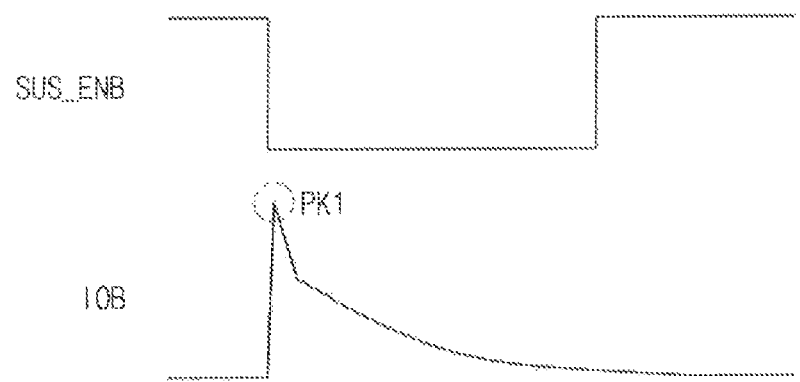
FIG. 11A is a waveform diagram illustrating a peak current of an on bias voltage applying portion when an on bias voltage of the on bias driver of FIG. 8 is not adjusted.
Figure 11B:
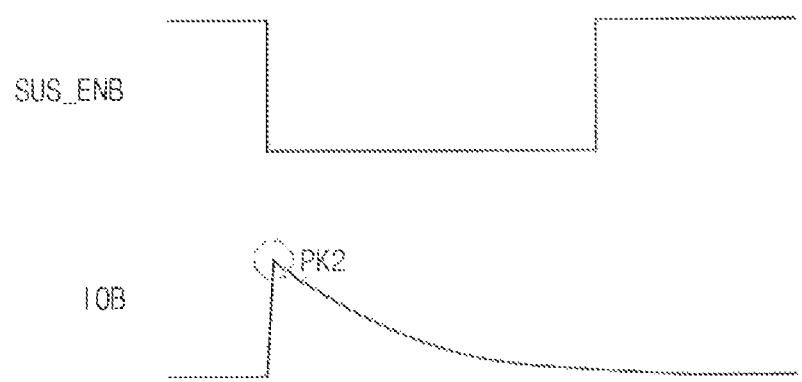
FIG. 11B is a waveform diagram illustrating the peak current of the on bias voltage applying portion when the on bias voltage of the on bias driver of FIG. 8 is adjusted.

FIG. 8 is a block diagram illustrating a display apparatus according to an exemplary embodiment of the inventive concept. FIG. 9 is a circuit diagram illustrating an on bias driver of FIG. 8 and a display panel of FIG. 8 according to an exemplary embodiment of the inventive concept. FIG. 10 is a timing diagram illustrating input and output signals of the on bias driver of FIG. 8 and a pixel of the display panel of FIG. 8 according to an exemplary embodiment of the inventive concept. FIG. 11A is a waveform diagram illustrating a peak current of an on bias voltage applying portion when an on bias voltage of the on bias driver of FIG. 8 is not adjusted. FIG. 11B is a waveform diagram illustrating the peak current of the on bias voltage applying portion when the on bias voltage of the on bias driver of FIG. 8 is adjusted.

The method of driving the display panel and the display apparatus according to the present exemplary embodiment is substantially the same as the method described with reference to FIGS. 1 to 5B, except for the level of the data sustaining voltage, the level of the on bias voltage, and the structure of the on bias driver. Thus, the same reference numerals will be used to refer to the same or like parts as those described with reference to FIGS. 1 to 5B, and any repetitive explanations concerning these elements will be omitted.

Referring to FIGS. 8 to 11B, the display apparatus includes the display panel 100 and the display panel driver. The display panel driver includes the timing controller 200, the gate driver 300, the gamma reference voltage generator 400, the data driver 500, an on bias driver 600A, the compensating driver 700, the first power controller 800, and the second power controller 900.

The on bias driver 600A outputs an on bias voltage to the data line DL in response to the on bias control signal SUS_ENB and a compensating on bias control signal VOBCTR.

In the present exemplary embodiment, the on bias voltage may have at least two different levels. In contrast, the data sustaining voltage may have one level.

During the on bias compensating period T1, the on bias voltage may increase from a first on bias voltage level VOB1 to a second on bias voltage level VOB2 that is greater than the first on bias voltage level VOB1.

The on bias driver 600A may include a first on bias switching element TRO1 outputting the on bias voltage having the first on bias voltage level VOB1 to the data line DL in response to the on bias control signal SUS_ENB and a second on bias switching element TRO2 outputting the on bias voltage having the second on bias voltage level VOB2 to the data line DL in response to the compensating on bias control signal VOBCTR.

In the present exemplary embodiment, the on bias driver 600A may be commonly connected to the all of the data lines DL of the display panel 100.

Right before the on bias period T2 (e.g., during the on bias compensating period T1), the on bias voltage having the second on bias voltage level VOB2 is applied to the pixel P through the data line DL. During the on bias period T2, the on bias voltage having the first on bias voltage level VOB1 is applied to the pixel through the data line DL.

As shown in FIG. 11A, if the on bias voltage has a single voltage level, when the on bias control signal SUS_ENB decreases to a low level, the voltage at the first node NA suddenly drops from the data sustaining voltage VS to the on bias voltage (e.g., VOB1 in FIG. 10) remaining at the data line DL. As a result, a high peak current (PK1 of JOB) flows through a signal transmitting line connecting the on bias driver 600A to all of the data lines DL of the display panel 100. Thus, the signal transmitting line may be damaged.

On the other hand, in the present exemplary embodiment, during the on bias compensating period T1, which is prior to the on bias period T2, the level of the on bias voltage applied to the data line DL is adjusted. During the on bias compensating period T1, the on bias voltage may increase from the first on bias voltage level VOB1 to the second on bias voltage level VOB2 that is greater than the first on bias voltage level VOB1.

For example, the on bias driver 600A may increase the on bias voltage from the first on bias voltage level VOB1 to the second on bias voltage level VOB2 in response to the compensating on bias control signal VOBCTR.

When the on bias voltage applied to the data line DL increases to the second on bias voltage level VOB2, the amount of change of the voltage at the first node NA during the on bias period T2 decreases.

Therefore, as shown in FIG. 11B, when the on bias control signal SUS_ENB decreases to a low level during the on bias period T2, the amount of change of the voltage at the first node NA decreases and thus, the peak current (PK2 of IOB) flowing through the signal transmitting line is less than the peak current (PK1 of IOB) flowing through the signal transmitting line in FIG. 11A.

According to the present exemplary embodiment, during the on bias compensating period T1 which is prior to the on bias period T2, the on bias voltage applied to the data lines DL increases from the first on bias voltage level VOB1 to the second on bias voltage level VOB2, so that the peak current flowing through the signal transmitting line connecting the on bias driver 600A to the data lines DL may decrease. Thus, damage to the signal transmitting line may be prevented.

Figure 12:
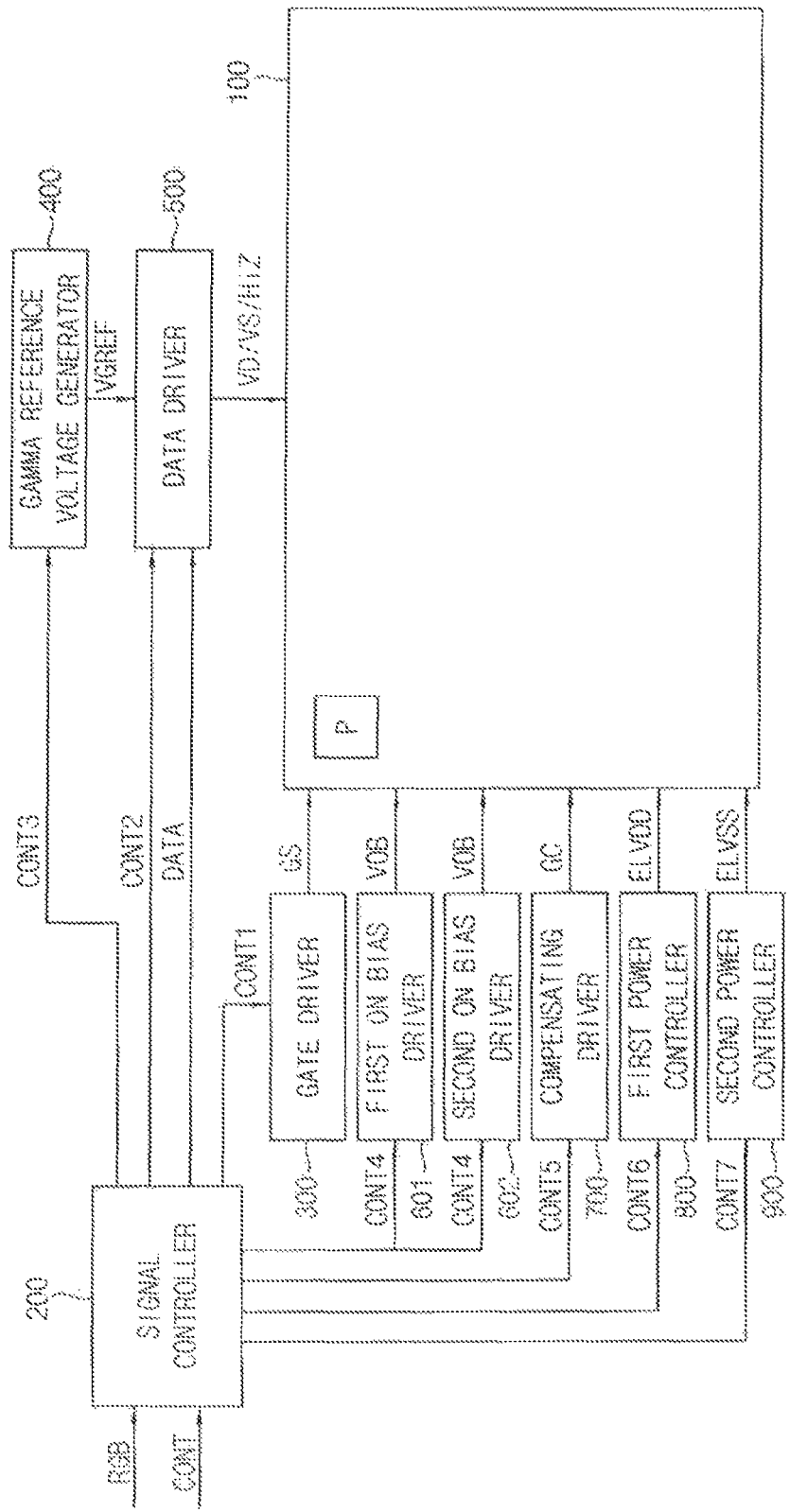
FIG. 12 is a block diagram illustrating a display apparatus according to an exemplary embodiment of the inventive concept.
Figure 13A:
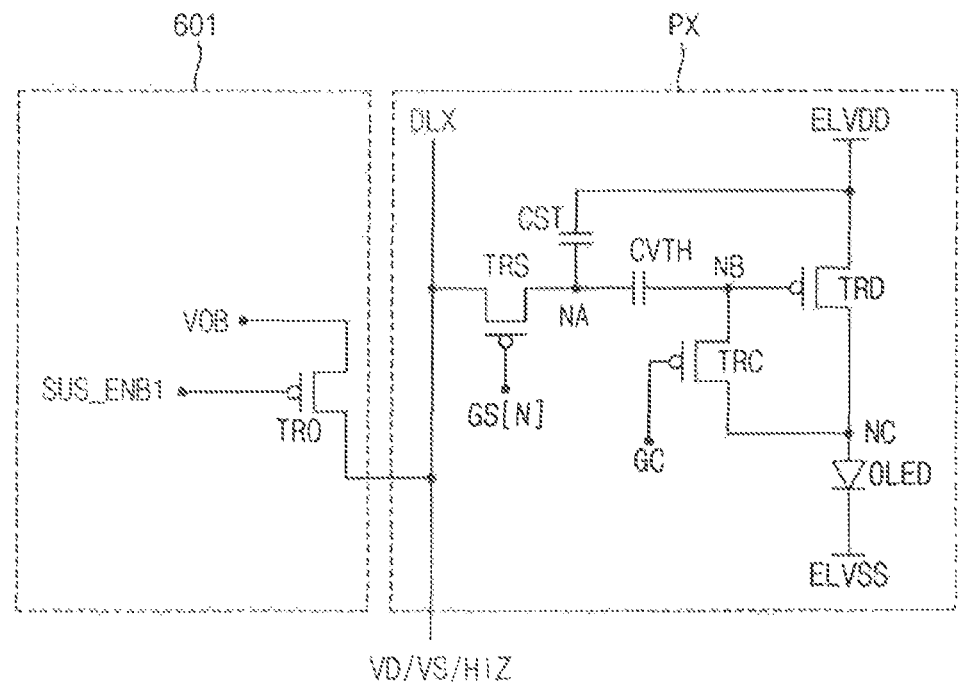
FIG. 13A is a circuit diagram illustrating a first on bias driver of FIG. 12 and a pixel connected to the first on bias driver of FIG. 12 according to an exemplary embodiment of the inventive concept.
Figure 13B:
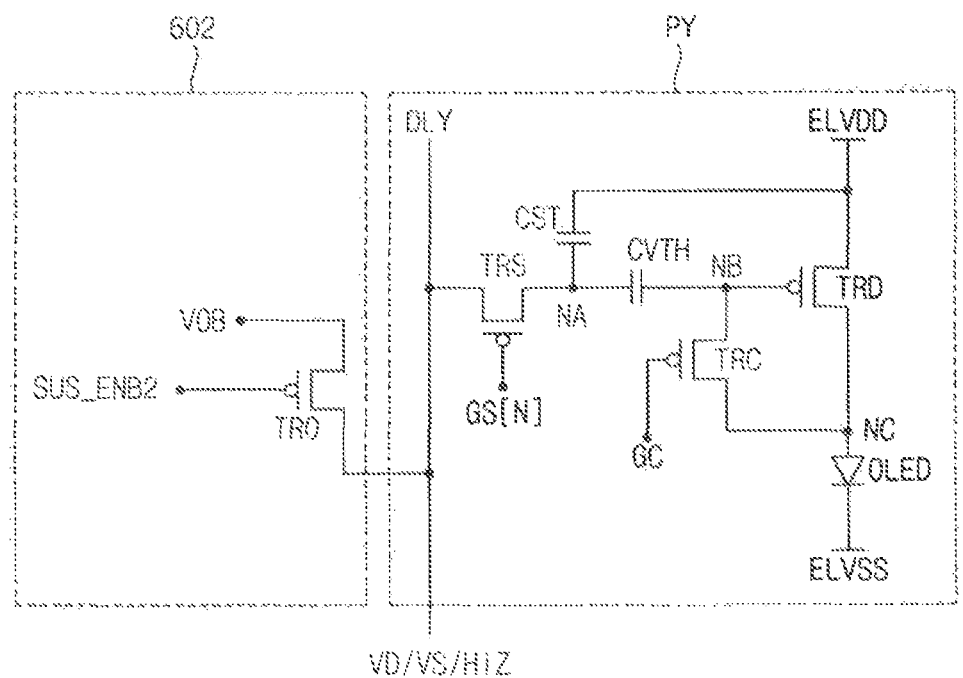
FIG. 13B is a circuit diagram illustrating a second on bias driver of FIG. 12 and a pixel connected to the second on bias driver of FIG. 12 according to an exemplary embodiment of the inventive concept.
Figure 15A:
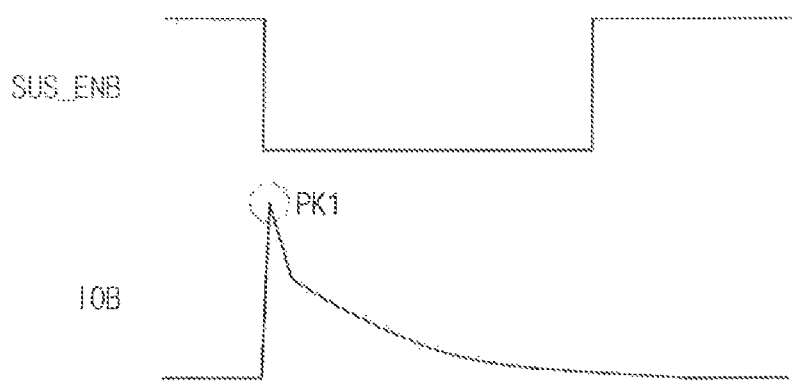
FIG. 15A is a waveform diagram illustrating a peak current of an on bias voltage applying portion when a display apparatus includes only an on bias driver.
Figure 15B:
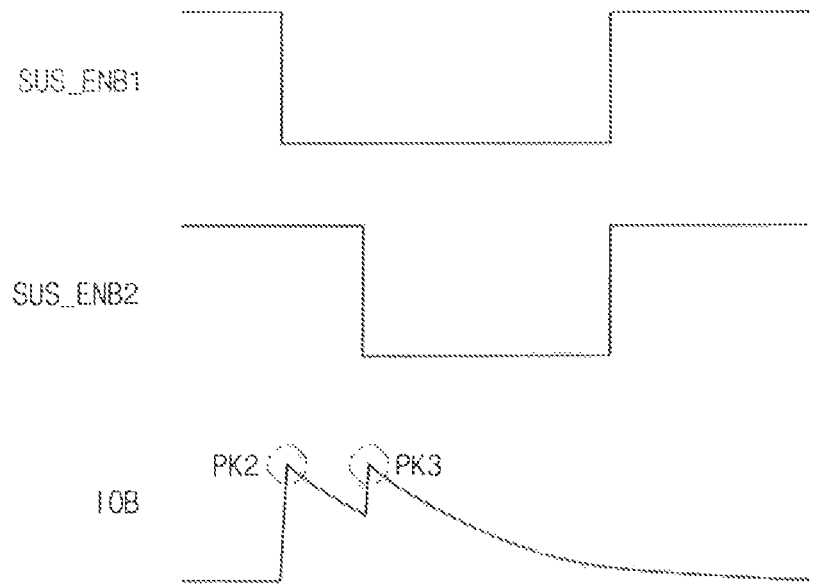
FIG. 15B is a waveform diagram illustrating the peak current of the on bias voltage applying portion when the display apparatus includes the first and second on bias drivers of FIG. 12.

FIG. 12 is a block diagram illustrating a display apparatus according to an exemplary embodiment of the inventive concept. FIG. 13A is a circuit diagram illustrating a first on bias driver 601 of FIG. 12 and a pixel PX connected to the first on bias driver 601 of FIG. 12 according to an exemplary embodiment of the inventive concept. FIG. 13B is a circuit diagram illustrating a second on bias driver 602 of FIG. 12 and a pixel PY connected to the second on bias driver 602 of FIG. 12 according to an exemplary embodiment of the inventive concept. FIG. 14 is a timing diagram illustrating input and output signals of the first and second on bias drivers 601 and 602 of FIG. 12 and pixels PX and PY of the display panel 100 of FIG. 12 according to an exemplary embodiment of the inventive concept. FIG. 15A is a waveform diagram illustrating a peak current of an on bias voltage applying portion when a display apparatus includes only one on bias driver. FIG. 15B is a waveform diagram illustrating a peak current of the on bias voltage applying portion when the display apparatus includes the first and second on bias drivers 601 and 602 of FIG. 12 according to an exemplary embodiment of the inventive concept.

The method of driving the display panel and the display apparatus according to the present exemplary embodiment is substantially the same as the method previously described with reference to FIGS. 1 to 5B, except for the level of the data sustaining voltage, the level of the on bias voltage, and the structure of the on bias driver. Thus, the same reference numerals will be used to refer to the same or like parts as those described with reference to FIGS. 1 to 5B, and any repetitive explanations concerning these elements will be omitted.

Referring to FIGS. 12 to 15B, the display apparatus includes the display panel 100 and the display panel driver. The display panel driver includes the timing controller 200, the gate driver 300, the gamma reference voltage generator 400, the data driver 500, a first on bias driver 601, a second on bias driver 602, the compensating driver 700, the first power controller 800, and the second power controller 900.

The first on bias driver 601 may include the on bias switching element TRO that outputs the on bias voltage VOB to a data line DLX in response to a first on bias control signal SUS_ENB1.

The on bias switching element TRO of the first on bias driver 601 includes a control electrode to which the first on bias control signal SUS_ENB1 is applied, a first electrode to which the on bias voltage VOB is applied, and a second electrode connected to the data line DLX of a first group.

In the present exemplary embodiment, the first on bias driver 601 may be commonly connected to the data lines DLX of the first group which are connected to the pixels PX of the first group of the display panel 100

The second on bias driver 602 may include the on bias switching element TRO that outputs the on bias voltage VOB to a data line DLY in response to a second on bias control signal SUS_ENB2.

The on bias switching element TRO of the second on bias driver 602 includes a control electrode to which the second on bias control signal SUS_ENB2 is applied, a first electrode to which the on bias voltage VOB is applied, and a second electrode connected to the data line DLY of a second group.

In the present exemplary embodiment, the second on bias driver 602 may be commonly connected to the data lines DLY of the second group which are connected to the pixels PX of the second group of the display panel 100

In a first timing in the on bias period T2, the first on bias driver 601 applies the on bias voltage VOB to the pixels (e.g., PX in FIG. 13A) of the first group through the data line DLX in response to the first on bias control signal SUS_ENB1.

In a second timing in the on bias period T2, the second on bias driver 602 applies the on bias voltage VOB to the pixels (e.g., PY in FIG. 13B) of the second group through the data line DLY in response to the second on bias control signal SUS_ENB2.

In the present exemplary embodiment, the on bias voltage VOB may have a single level. The level of the on bias voltage VOB applied to the pixels PX of the first group may be substantially the same as the level of the on bias voltage VOB applied to the pixels PY of the second group.

In addition, the data sustaining voltage VS applied to all of the pixels may have a single level.

FIG. 15A represents the peak current of the on bias voltage applying portion when all of the data lines are connected to a single on bias driver. As shown in FIG. 15A, if the on bias voltage has a single voltage level, when the on bias control signal SUS_ENB decreases to a low level, the voltage at the first node NA suddenly drops from the data sustaining voltage VS to the on bias voltage (e.g., VOB1 in FIG. 10) remaining at the data line DL. As a result, a high peak current (PK1 of JOB) flows through a signal transmitting line connecting the on bias driver to all of the data lines DL of the display panel 100. Thus, the signal transmitting line may be damaged.

On the other hand, in the present exemplary embodiment, the plural on bias drivers (e.g., the first and second on bias drivers 601 and 602) are connected to the groups of the data lines (e.g., the first and second groups) and the on bias drivers have on bias control signals SUS_ENB1 and SUS_ENB2 with different timings. As such, relatively small peak currents (PK2 and PK3 of JOB) flow through the signal transmitting lines connecting the on bias drivers to the groups of data lines DLX and DLY of the display panel 100.

The display apparatus may include a plurality of data driving chips generating the data voltage. The data driving chips may have different timings to apply the on bias voltage.

For example, the display apparatus may include four data driving chips. Pixels of a first group may be connected to a first driving chip through data lines of the first group. Pixels of a second group may be connected to a second driving chip through data lines of the second group. Pixels of a third group may be connected to a third driving chip through data lines of the third group. Pixels of a fourth group may be connected to a fourth driving chip through data lines of the fourth group.

The first data driving chip may have a first on bias control signal having a first timing. The pixels connected to the first driving chip may be connected to the first on bias driver which applies the on bias voltage in response to the first on bias control signal.

The second data driving chip may have a second on bias control signal having a second timing different from the first timing. The pixels connected to the second driving chip may be connected to the second on bias driver which applies the on bias voltage in response to the second on bias control signal.

The third data driving chip may have a third on bias control signal having a third timing different from the first timing and the second timing. The pixels connected to the third driving chip may be connected to the third on bias driver which applies the on bias voltage in response to the third on bias control signal.

The fourth data driving chip may have a fourth on bias control signal having a fourth timing different from the first timing, the second timing, and the third timing. The pixels connected to the fourth driving chip may be connected to the fourth on bias driver which applies the on bias voltage in response to the fourth on bias control signal.

As explained above, the on bias voltage is applied to the pixels of the display panel 100 with different timings so that the peak current flowing through the signal transmitting line of the on bias drivers may be decreased. Thus, damage to the signal transmitting line may be prevented.

Although the display apparatus includes four data driving chips in the present exemplary embodiment for convenience of explanation, the inventive concept is not limited thereto and the number of data driving chips may vary.

According to the present exemplary embodiment, during the on bias period T2, the timing of applying the on bias voltage to the data lines DL is adjusted so that the peak current flowing through the signal transmitting line, which connects the on bias driver 600 to the data lines DL, may decrease. Thus, damage to the signal transmitting line may be prevented.

As explained above, according to exemplary embodiments of the inventive concept, in the simultaneous emission method of driving the display panel and the display apparatus performing the method, the peak current flowing through the signal transmitting line in the on bias period is decreased and damage to the signal transmitting line of the on bias driver is prevented. Thus, the productivity of the display apparatus may be increased.

While the inventive concept has been shown and described with reference to the exemplary embodiments thereof, it will be understood by those of ordinary skill in the art that various changes in form and details may be made thereto without departing from the spirit and scope of the present inventive concept as defined by the following claims.

What is claimed is:

1. A method of driving a display panel, the method comprising:
    adjusting a level of a data sustaining voltage or an on bias voltage during an on bias compensating period;
    applying the on bias voltage to a first node of pixels through data lines and through a switching transistor of a corresponding pixel during an on bias period, which is subsequent to the on bias compensating period, to adjust a voltage level of control electrodes of driving transistors of the pixels;
    initiating a voltage of anode electrodes of organic light emitting elements of the pixels during an initiating period;
    applying data voltages to the first node of the pixels through the data lines and through the switching transistor of the correspond pixel during a scanning period; and
    turning on the organic light emitting elements of the pixels during an emission period.

2. The method of claim 1, further comprising:
decreasing an on bias control signal from a high level to a low level to output the on bias voltage.

3. The method of claim 1, wherein during the on bias period, an output of a data driver has a high impedance state, switching elements of the pixels are turned on, a first power voltage has a high level, and a second power voltage has a high level.

4. The method of claim 3, wherein during the initiating period, the output of the data driver has the high impedance state, the switching elements of the pixels are turned on, the first power voltage has a low level, and the second power voltage has a high level.

5. The method of claim 1, wherein the data sustaining voltage has at least two different levels.

6. The method of claim 5, wherein during the on bias compensating period, the data sustaining voltage decreases from a first data sustaining voltage level to a second data sustaining voltage level that is less than the first data sustaining voltage level.

7. The method of claim 5, wherein the data sustaining voltage has at least three different levels, and
the data sustaining voltage decreases in a steplike fashion during the on bias compensating period.

8. The method of claim 5, wherein the level of the data sustaining voltage is determined by a duty ratio of a sustaining voltage control signal.

9. The method of claim 1, wherein the on bias voltage has at least two different levels.

10. The method of claim 9, wherein during the on bias compensating period, the on bias voltage increases from a first on bias voltage level to a second on bias voltage level that is greater than the first on bias voltage level.

11. The method of claim 10, wherein the on bias voltage having the first on bias voltage level is transmitted to the data lines through a first on bias switching element, and
the on bias voltage having the second on bias voltage level is transmitted to the data lines through a second on bias switching element.

12. A display apparatus comprising:
a display panel including a plurality of pixels;
a gate driver configured to apply gate signals to the plurality of pixels through gate lines;
a data driver configured to apply data voltages to the plurality of pixels through data lines;
an on bias driver configured to apply an on bias voltage to the plurality of pixels through the data lines during an on bias period to adjust a voltage level of control electrodes of driving transistors of the pixels;
a first power controller configured to apply a first power voltage to the plurality of pixels; and
a second power controller configured to apply a second power voltage to the plurality of pixels,
wherein during an on bias compensating period, which is prior to the on bias period, a level of a data sustaining voltage of the data driver or the on bias voltage of the on bias driver is adjusted,
wherein the on bias voltage is applied to a first pixel among the plurality of pixels through a first data line among the data lines, and
wherein a first data voltage among the data voltages is applied to the first pixel through the first data line.

13. The display apparatus of claim 12, wherein at least one of the plurality of pixels comprises:
a switching transistor configured to turn on in response to one of the gate signals;
a compensating transistor configured to turn on in response to a compensating control signal;
a driving transistor configured to turn on in response to a signal at a first electrode of the compensating transistor; and
an organic light emitting element connected to the driving transistor.

14. The display apparatus of claim 12, wherein the on bias driver is one on bias driver commonly connected to all of the data lines.

15. The display apparatus of claim 12, wherein the data driver is further configured to output the data sustaining voltage having at least two different levels.

16. The display apparatus of claim 15, wherein the on bias driver comprises an on bias switching element configured to output the on bias voltage to the data lines in response to an on bias control signal.

17. The display apparatus of claim 12, wherein the on bias driver is further configured to output the on bias voltage having at least two different levels.

18. The display apparatus of claim 17, wherein the on bias driver comprises:
a first on bias switching element configured to output the on bias voltage having a first on bias voltage level to the data lines in response to an on bias control signal; and
a second on bias switching element configured to output the on bias voltage having a second on bias voltage level, which is greater than the first on bias voltage level, to the data lines in response to a compensating on bias control signal.

19. A method of driving a display panel comprising a plurality of pixels connected to data lines, divided into a first group and a second group, the method comprising:
applying an on bias voltage to pixels of the first group through data lines of the first group with a first timing in an on bias period to adjust a voltage level of control electrodes of driving transistors of the pixels of the first group in response to a first on bias control signal;
applying the on bias voltage to pixels of the second group through data lines of the second group with a second timing in the on bias period to adjust a voltage level of control electrodes of driving transistors of the pixels of the second group in response to a second on bias control signal, wherein the second on bias control signal is activated after the first on bias control signal is activated;
initiating a voltage of anode electrodes of organic light emitting elements of the pixels of the first and second groups during an initiating period;
applying data voltages to the pixels of the first and second groups through the data lines during a scanning period; and
turning on the organic light emitting elements of the pixels of the first and second groups during an emission period.

20. The method of claim 19, wherein data driving chips configured to generate the data voltages have different timings for applying the on bias voltage.

* * * * *